United States Patent
Mooney

(10) Patent No.: US 8,320,704 B2
(45) Date of Patent: Nov. 27, 2012

(54) METHOD FOR CREATING REFERENCE IMAGES IN ELECTRON MICROSCOPES

(75) Inventor: Paul E. Mooney, Pleasanton, CA (US)

(73) Assignee: Gatan, Inc., Warrendale, PA (US)

( * ) Notice: Subject to any disclaimer, the term of this patent is extended or adjusted under 35 U.S.C. 154(b) by 1011 days.

(21) Appl. No.: 12/235,366

(22) Filed: Sep. 22, 2008

(65) Prior Publication Data

US 2009/0080799 A1 Mar. 26, 2009

Related U.S. Application Data

(60) Provisional application No. 60/974,215, filed on Sep. 21, 2007.

(51) Int. Cl.
*G06K 9/40* (2006.01)

(52) U.S. Cl. ....... 382/275; 382/260; 382/274; 358/3.26; 358/3.27; 358/463

(58) Field of Classification Search ............... 382/260, 382/274, 275; 358/3.26, 3.27, 463
See application file for complete search history.

(56) References Cited

U.S. PATENT DOCUMENTS

| | | | |
|---|---|---|---|
| 5,511,553 A * | 4/1996 | Segalowitz | 600/508 |
| 5,812,179 A * | 9/1998 | Pensavecchia et al. | 347/256 |
| 5,835,142 A * | 11/1998 | Nakamura et al. | 348/335 |
| 5,904,413 A * | 5/1999 | Ruegenberg et al. | 356/73.1 |
| 5,923,414 A * | 7/1999 | Wagner et al. | 356/73.1 |
| 6,290,382 B1 * | 9/2001 | Bourn et al. | 362/554 |
| 6,455,860 B1 | 9/2002 | Mooney | |
| 7,262,030 B2 * | 8/2007 | Chen | 435/91.2 |
| 7,519,406 B2 * | 4/2009 | Blank et al. | 600/310 |
| 7,635,848 B2 * | 12/2009 | Nelson | 250/370.11 |

\* cited by examiner

*Primary Examiner* — Yosef Kassa

(74) *Attorney, Agent, or Firm* — Caesar, Rivise, Bernstein, Cohen & Pokotilow, Ltd.

(57) ABSTRACT

Methods for creating reference images of fiber optic sensor plates for use in electron microscopes. The methods include taking of reference images of stripe or dot patterns. The spatial frequency of the stripe or dot patterns is such that image artifacts of the fiber optic stacks is recorded. The reference images can then be used to correct for these artifacts.

14 Claims, 9 Drawing Sheets

METHOD FOR CREATING REFERENCE IMAGES IN ELECTRON MICROSCOPES

CROSS-REFERENCE TO RELATED APPLICATIONS

This utility application claims the benefit under 35 U.S.C. §119(e) of Provisional Application Ser. No. 60/974,215 filed on Sep. 21, 2007 and entitled Method for Creating Reference Images in Electron Microscopes, the entire disclosure of which is incorporated by reference herein.

FIELD OF THE INVENTION

This invention relates to methods and apparatuses for correcting imaging artifacts in an electron microscope. More specifically, the invention relates to an improved method of generating reference images that capture information regarding imaging artifacts that result from distortions in fiber optic bundles that connect a scintillator to a charge coupled device for imaging.

BRIEF SUMMARY OF THE INVENTION

In an embodiment of the invention, a method for recording distortions in a fiber-optically coupled imaging device having a fiber-optic sensor stack includes the steps of placing an image of a stripe or 2-dimensional dot pattern of uniform spatial frequency in a position to be imaged by the imaging device and recording the image of a stripe or dot pattern.

In a further embodiment, the uniform spatial frequency of the stripe or dot pattern is between 0.25 and 0.5 of the size of the image pixel resolution of the imaging device.

In a further embodiment, the image of a stripe or dot pattern is on an opaque material on glass and the method included the additional step of illuminating the image of a stripe or dot pattern with visible light prior to the application of an electron-sensitive phosphor onto the fiber-optic plate.

In a further embodiment, a 1-D or 2-D periodic image is produced with electrons and imaged onto a sensor after a scintillator has been mounted onto the fused fiber-optic plate. In a further embodiment of producing the periodic image with electrons, the image of a stripe or dot pattern is produced by a perforated metal foil.

In a further embodiment a uniformly illuminated image is made as a gain reference to remove fixed-pattern gain variations from images of the stripe or dot pattern.

In a further embodiment the pattern is a stripe pattern wherein two images are recorded of said stripe pattern, and wherein said two images are recorded at an angle between each other, said angle being sufficient to record distortions in two dimensions.

In a further embodiment the angle between the stripe patterns is 90 degrees.

In a further embodiment the stripe pattern is tilted away from horizontal and vertical to prevent aliased harmonics of the strip pattern from overlapping a spatial frequency range around the fundamental spatial frequency of the stripe pattern which contains distortion information.

In a further embodiment the stripe or dot pattern comprises opaque material and said opaque material varies sinusoidally in optical density thereby minimizing the intensity of aliased frequencies.

In a further embodiment the fiber-optic sensor stack is comprised of fiber-optic plates and said fiber-optic plates are fixed to each other prior to recording of the distortion pattern so that the distortion pattern remains constant throughout the service life of the sensor.

In a further embodiment, a method of correcting optical artifacts in a fiber-optic stack includes the steps of: placing an image of a stripe or dot pattern of uniform spatial frequency in a position to be imaged through the fiber-optic stack; recording the image of a stripe or dot pattern and using the recorded image as a reference image to correct subsequent images made through the fiber-optic stack.

BRIEF DESCRIPTION OF SEVERAL VIEWS OF THE DRAWINGS

The invention will be described in conjunction with the following drawings in which like reference numerals designate like elements and wherein.

DETAILED DESCRIPTION OF THE INVENTION

Figure 1:
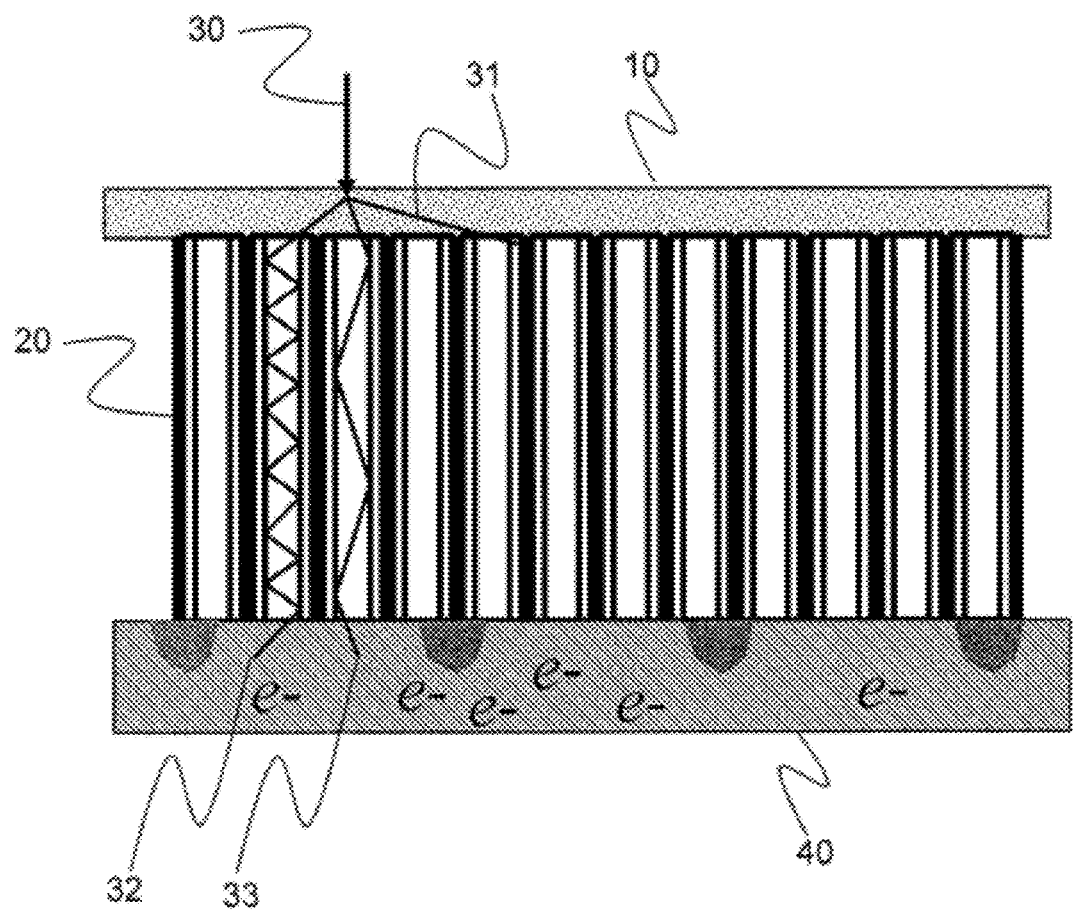
FIG. 1 is a diagram of a prior art image sensor for an electron microscope.

As shown in FIG. 1, high-sensitivity prior art digital cameras for transmission electron microscopes use fused fiber-optic plates 20 to transfer an image generated in a scintillator 10 by the electron beam 30 to the image sensor 40 a CCD or CMOS detector. The fiber plate 20 is located between the scintillator 10 and the image sensor 40. The combination of the scintillator, fiber optic plate and image sensor has many advantages well known in the art, including the fact that the fiber-optic place accepts even high-angle photons 31 generated in the scintillator, which generates many photons 32, 33 from each high energy electron that reaches the scintillator. The fiber optic plate also stops the electrons e—before they reach the CCD. Prior art patents describing the use of fiber optic plates include U.S. Pat. Nos. 5,065,029, 6,455,860 and 7,091,492, the disclosures of which are incorporated herein by reference.

Figure 2:
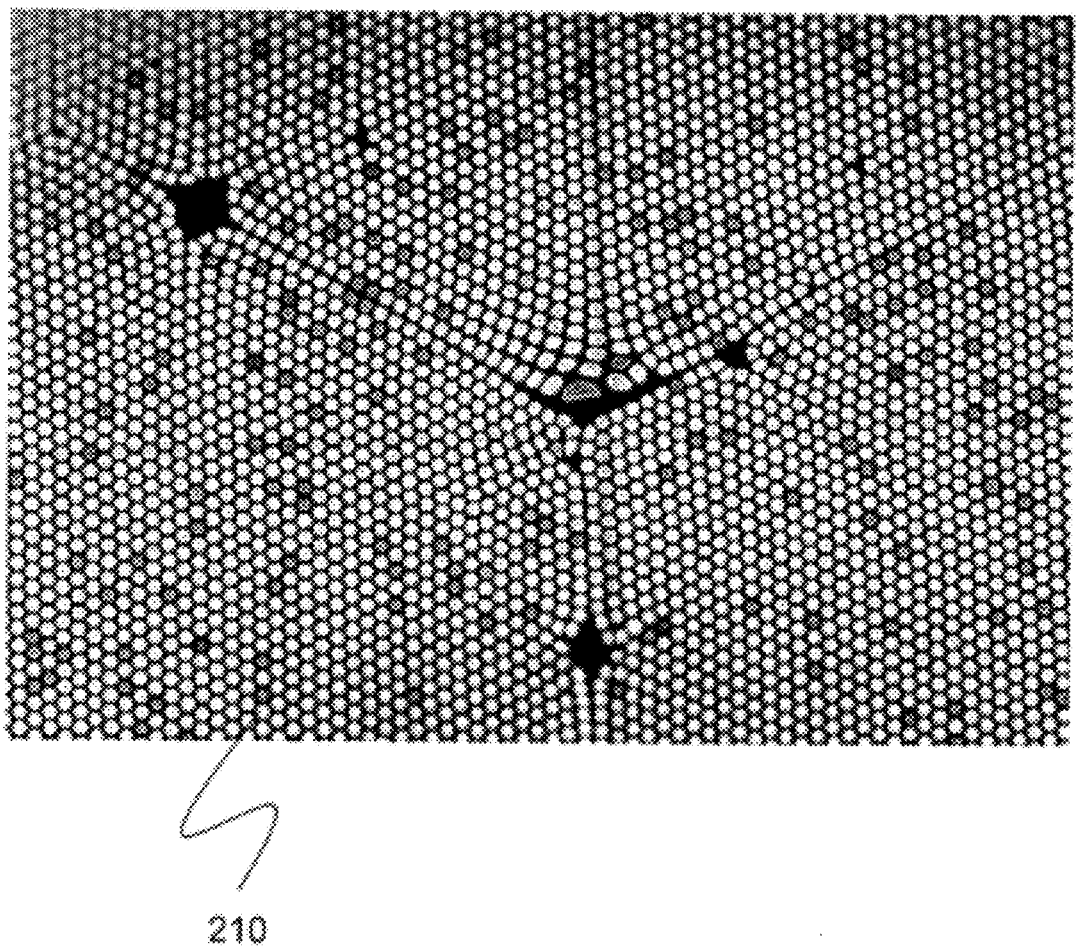
FIG. 2 is diagram of a fused fiber optic plate.

As shown in FIG. 2, in a fused-fiber-optic plate, individual fibers 210 are stacked in bundles, drawn thin and then restacked, resulting in some distortion, evident in the gapped area in the center of the figure.

Figure 3:
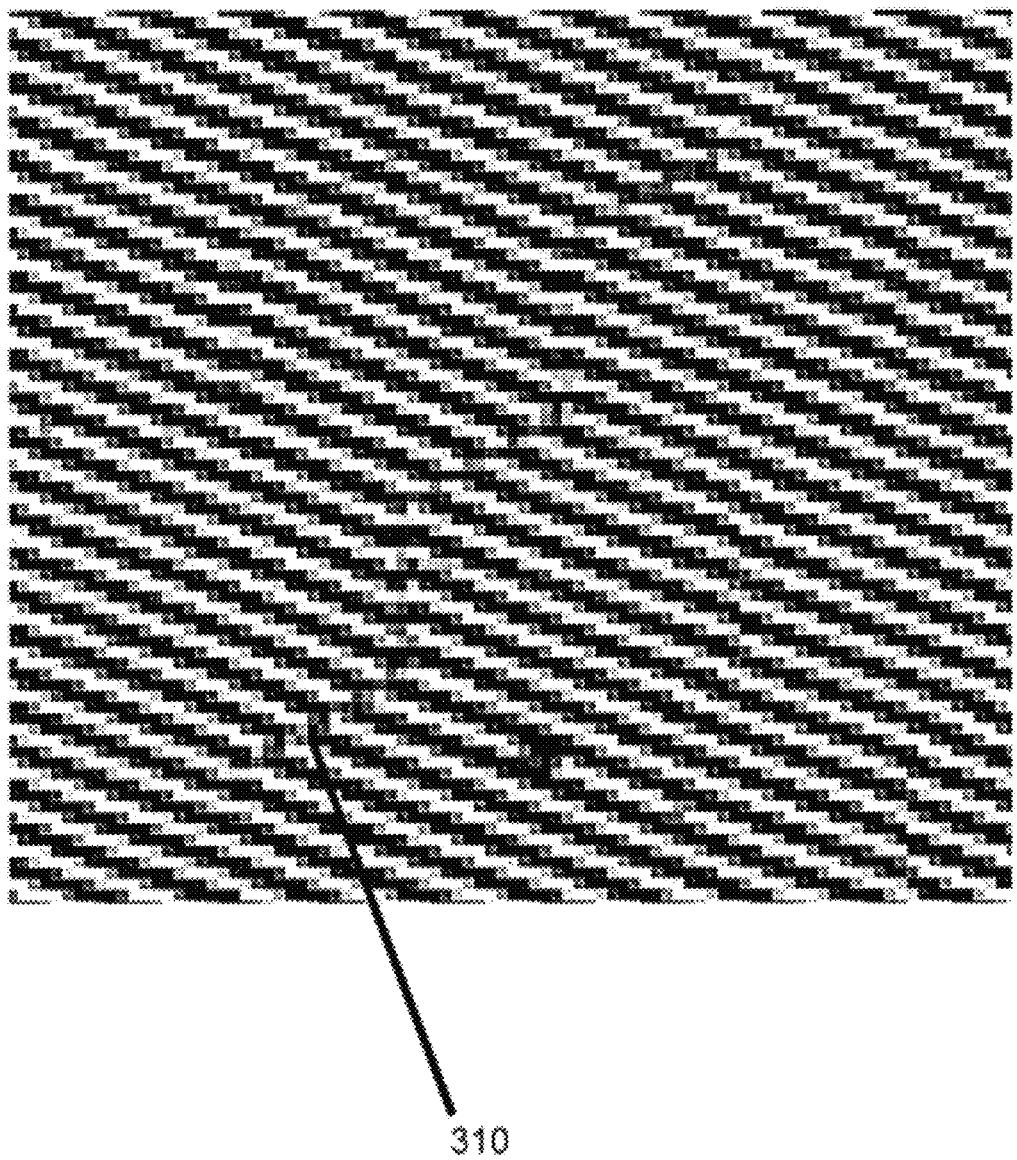
FIG. 3 is an image of a Ronchi stripe pattern as transferred to an image sensor revealing the distortion caused by the fused fiber optic plate.

As shown in FIG. 3, an image of a stripe pattern imposed on a fiber optic bundle plate makes distortions 310 visible in a fiber-optic coupled to a CCD. The inventor has discovered that distortions in fiber optic plates can be measured and corrected by the following exemplary methods.

Figure 4:
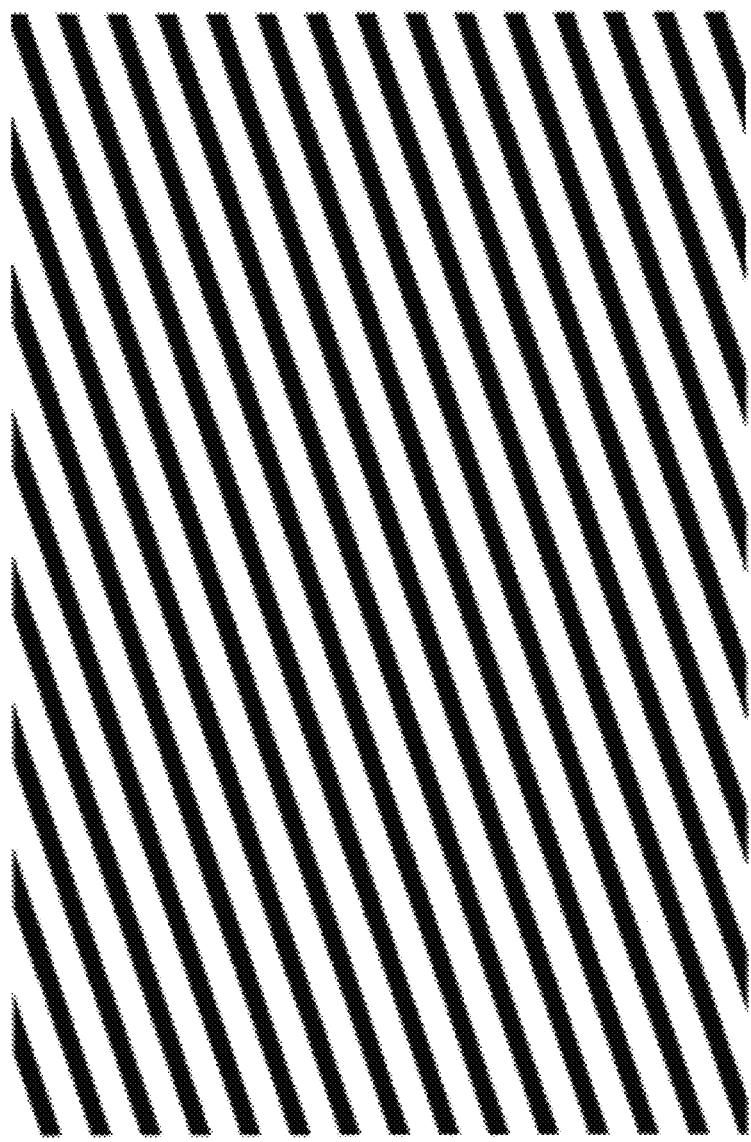
FIG. 4 is an illustration of a one-dimensional periodic pattern, also known as a Ronchi stripe pattern.
Figure 5:
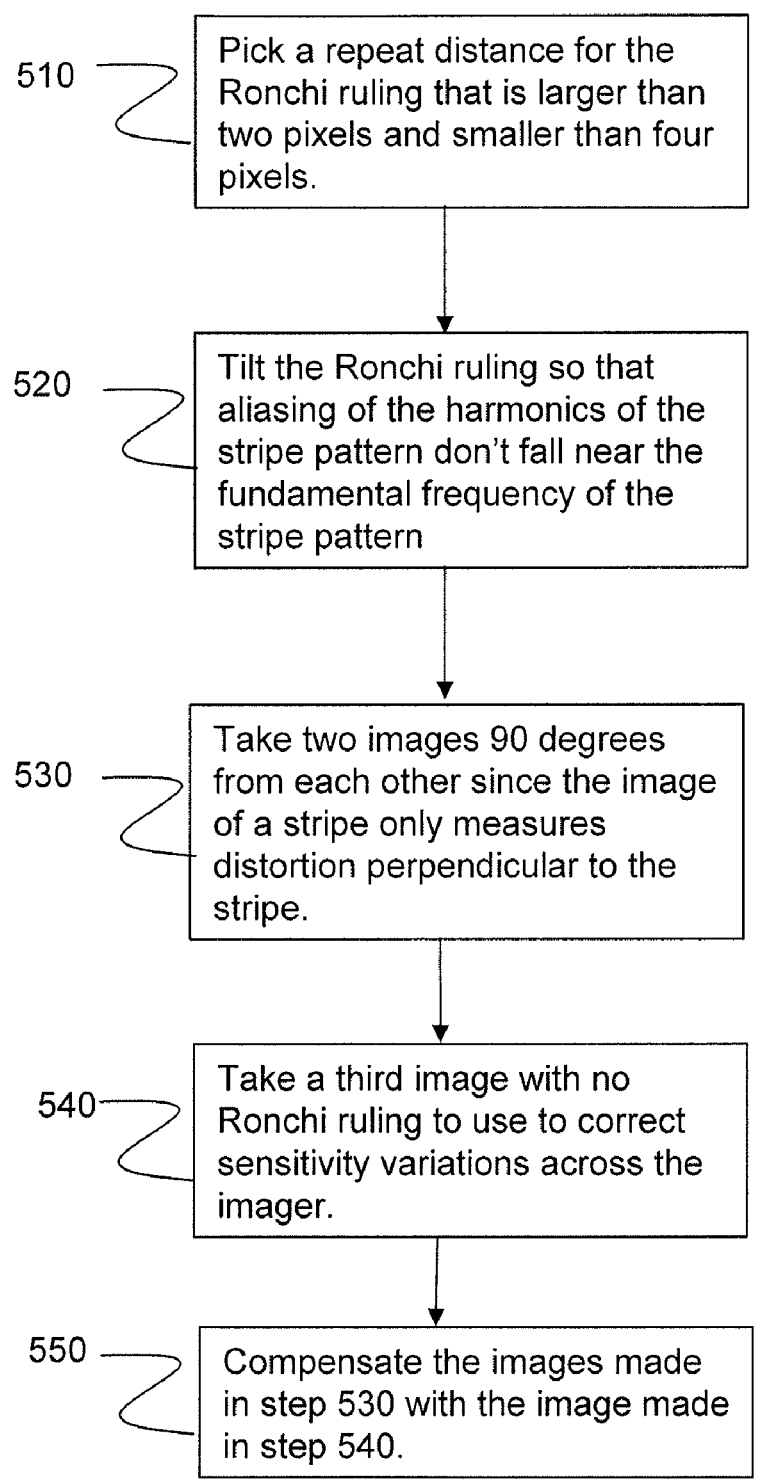
FIG. 5 is a flow diagram of an exemplary process for making a reference image.

Distortion in a fiber optic bundle is measured by making a Ronchi ruling image on the device. Ronchi rulings (FIG. 4) are equal bar and space square wave targets, having very high contrast ratio and edge definition. According to an exemplary method, described in flow diagram in FIG. 5, a Ronchi ruling with constant spatial frequency (straight stripes with constant even spacing and equal amounts of area covered and uncovered) is selected. At method step 510, a repeat distance for the Ronchi ruling is chosen that is larger than two pixels and smaller than four pixels. At step 520, the Ronchi ruling is tilted so that aliasing of the harmonics of the stripe pattern do not fall near the fundamental frequency of the stripe pattern. At step 530, two images are taken 90 degrees from each other, since the image of a stripe only measures distortion perpendicular to the stripe. At step 540, a third image is taken with no Ronchi ruling to use to correct sensitivity variations across the imager. At step 550, the images mage in step 520 are gain compensated using the reference image made in step 540

Figure 8:
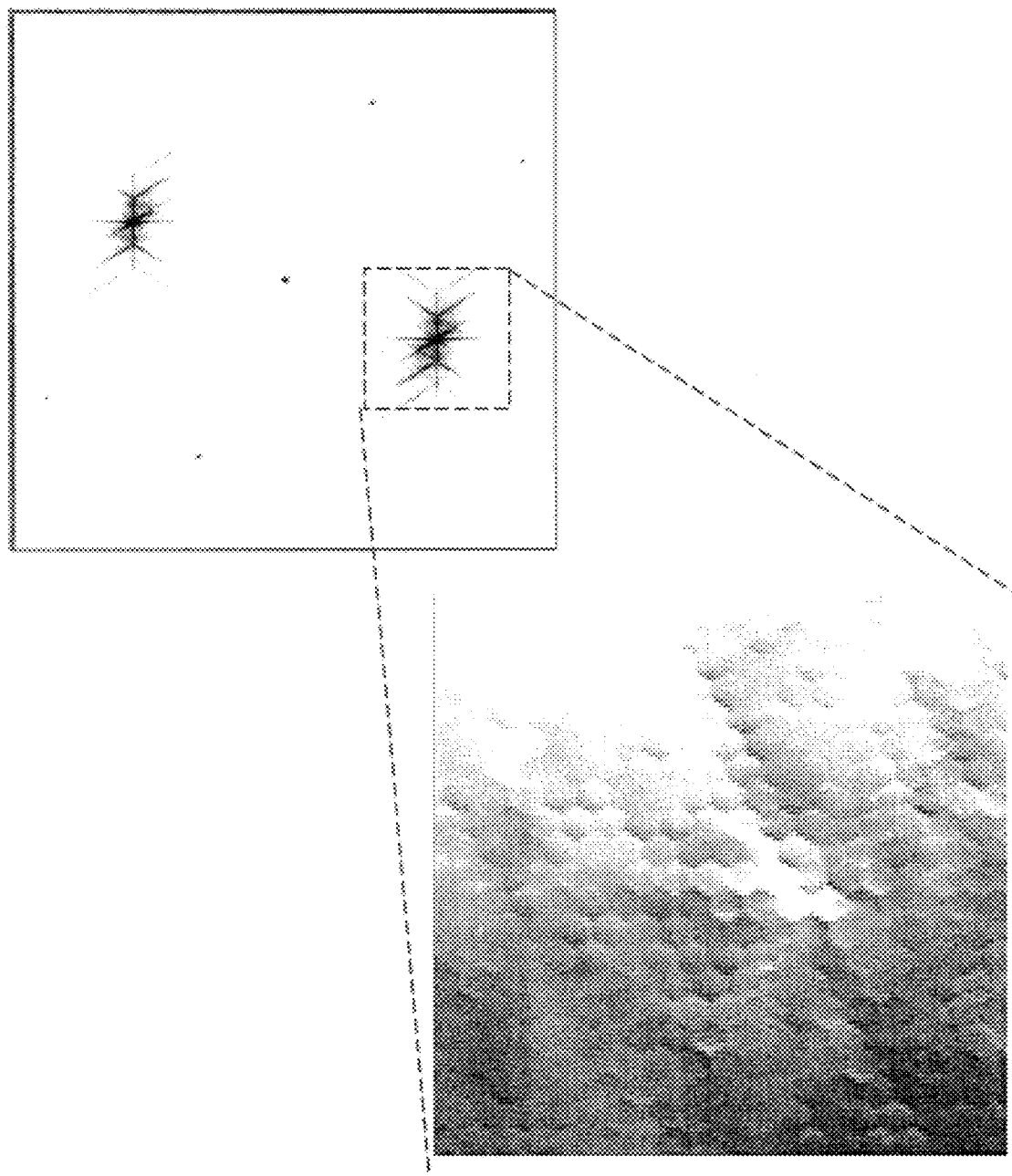
FIG. 8 is an illustration of the distortion in FIG. 7 reconstructed at least to 4-pixel resolution by an inverse FFT followed by phase extraction.

The method shown in FIG. 8 is one of a number of ways to use the Ronchi images to correct distortions. In some cases, this is the best method, in others, it isn't. For applications of electron microscopes which are interested in deriving the phase of periodic objects, such as electron holography or strain mapping this method or an extension of this method to full resolution are the appropriate method. For applications interested in image distortions in particular, such as membrane segmentation, electron tomography or spectroscopy, distortion correction using these reference images would be built into application processing.

Figure 6:
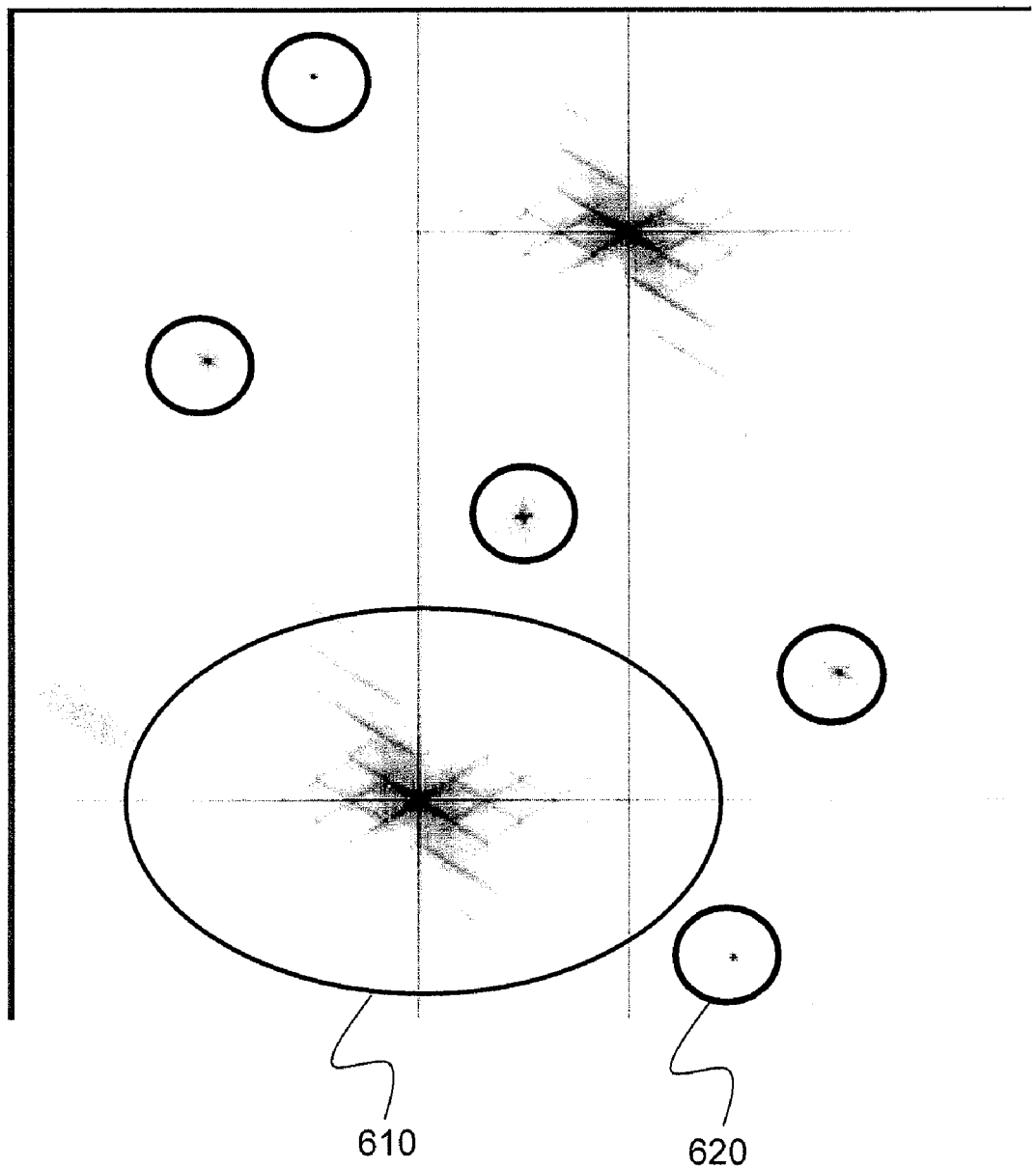
FIG. 6 is an illustration of an FFT of a reference image made with Ronchi stripes at −22.5 degrees showing sidebands containing distortion information and aliased higher-order frequency components of the square-wave Ronchi pattern.
Figure 7:
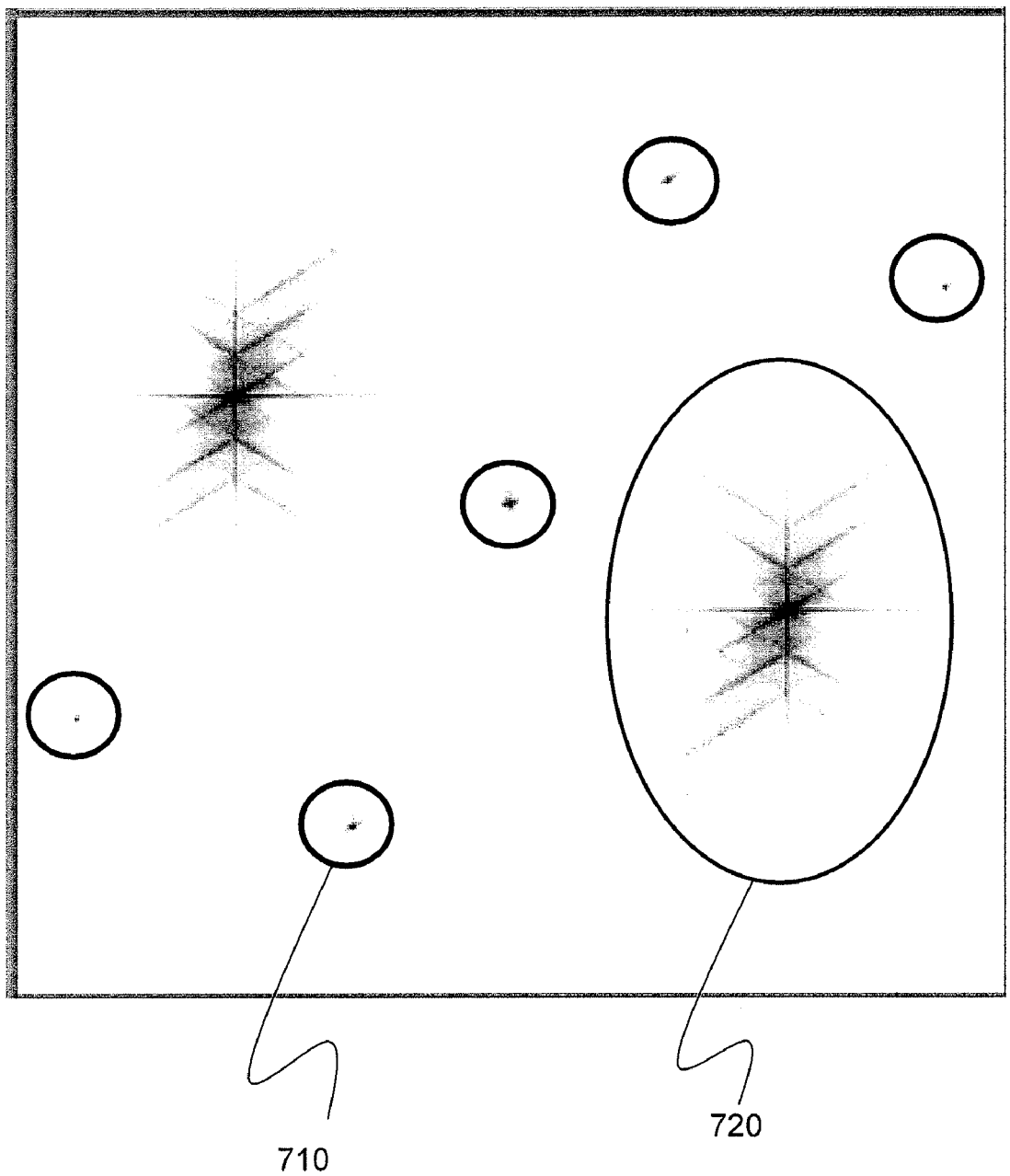
FIG. 7 is an illustration of an FFT of a reference image made with Ronchi stripes at 67 degrees.

As seen in FIGS. 6 and 7, Information about distortions is contained in the sidebands of the Ronchi fundamental frequency. Information extends to frequencies beyond the Ronchi frequency away from the fundamental because the stripe is a continuum object in the direction of the stripe. Harmonics 610, 710 of the Ronchi fundamental are distant from the fundamental due to the tilt of the Ronchi ruling. This allows the information in the sidebands to be extracted separately from the aliased information in the Ronchi harmonics.

Partial Phase Reconstruction Example

FIG. 8 shows how phase, which is proportional to distortion perpendicular to the Ronchi stripes, can be reconstructed at least to 4-pixel resolution by an inverse FFT followed by phase extraction.

Figure 4A:
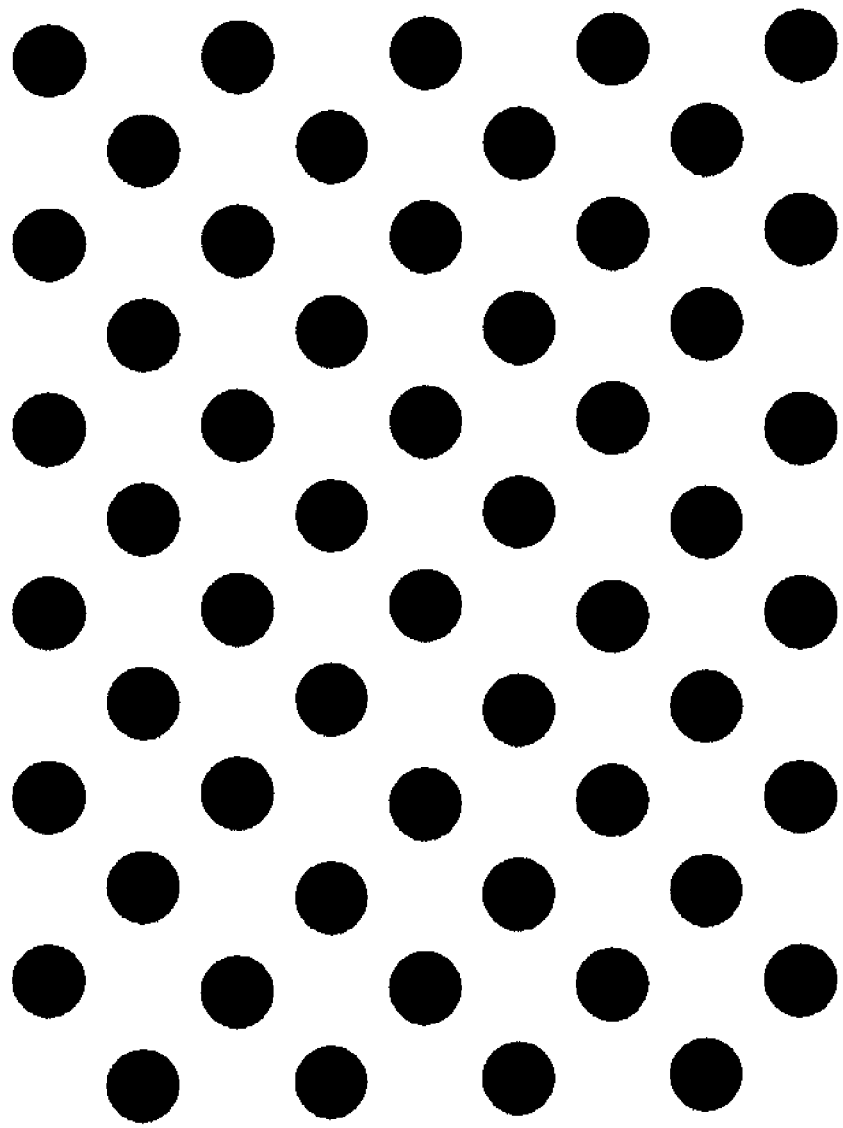
FIG. 4a is an illustration of a two dimensional periodic pattern.

In an alternative embodiment, it is also possible to measure distortion in both directions with a single image if the Ronchi pattern is 2-dimensional. FIG. 4a. However, the drawback of the two-dimensional pattern is that there are more harmonics to keep away from the sidebands. In addition, the continuum is lost in the stripe-parallel direction so some high-frequency information is lost from the sideband. However, it is difficult to make an electron-transmitting Ronchi mask which is one-dimensional so the two-dimensional array of perforations is preferred with electron illumination.

Making the Ronchi Image

Once a phosphor has been applied it is not possible to use light to create the Ronchi images. There are two options: 1) Take the images using a light-optical mask prior to phosphor coating. It is then necessary that the fiber-optic stack remains unchanged for the life of the detector. 2) Use a perforated mask or other means to create a Ronchi or 2 dimensional periodic image using electrons. This has the disadvantages noted above but is workable when necessary.

While the invention has been described in detail and with reference to specific examples thereof, it will be apparent to one skilled in the art that various changes and modifications can be made therein without departing from the spirit and scope thereof.

I claim:

1. A method for recording distortions in a fiber-optically coupled imaging device comprising a fiber-optic sensor stack, said method comprising:
    placing a primary image of a stripe or dot pattern of uniform spatial frequency in a position to be imaged by the imaging device; and
    recording a resultant image of said stripe or dot pattern.

2. The method of claim 1, wherein the imaging device has an image pixel resolution producing a resultant image pixel resolution and said uniform spatial frequency is between 0.25 and 0.5 of the size of said resultant image pixel resolution.

3. The method of claim 1 wherein said primary image of a stripe or dot pattern is on an opaque material on glass; further comprising:
    illuminating the image of a stripe or dot pattern with visible light prior to the application of an electron-sensitive phosphor onto the fiber-optic plate.

4. The method of claim 1 wherein said primary image of a stripe or dot pattern is on a self-supporting opaque material; further comprising:
    illuminating said primary image of a stripe or dot pattern with electrons after the application of an electron-sensitive phosphor onto the fiber-optic plate.

5. The method of claim 3 wherein said primary image of a stripe or dot pattern is on a perforated metal foil.

6. The method of claim 1 further comprising:
    imaging a uniformly illuminated primary image as a gain reference to remove fixed-pattern gain variations from resultant images of said stripe or dot pattern.

7. The method of claim 1 wherein said pattern is a stripe pattern wherein two resultant images are recorded of said stripe pattern, and wherein said two resultant images are recorded at an angle between each other, said angle being sufficient to record distortions in two dimensions.

8. The method of claim 7, wherein said angle between the stripe patterns is 90 degrees.

9. The method of claim 7 wherein the stripe pattern is tilted away from horizontal and vertical to prevent aliased harmonics of the stripe pattern from overlapping a spatial frequency range around the fundamental spatial frequency of the stripe pattern which contains distortion information.

10. The method of claim 1, wherein said stripe or dot pattern comprises opaque material and said opaque material varies sinusoidally in optical density thereby minimizing the intensity of aliased frequencies.

11. The method of claim 1, wherein said fiber-optic sensor stack is comprised of one or more fiber-optic plates and said fiber-optic plates are fixed to each other and to the image sensor prior to recording of the distortion pattern so that the distortion pattern remains constant throughout the service life of the sensor.

12. The method of claim 11, wherein said fiber-optic plates and sensor are fixed with glue.

13. The method of claim 11, wherein said fiber optic plates and sensor are fixed with a mechanical fixture.

14. A method of correcting optical artifacts in a fiber-optic stack, comprising:
    placing a primary image of a stripe or dot pattern of uniform spatial frequency in a position to be imaged through the fiber-optic stack;
    recording a resultant image of a stripe or dot pattern; and
    using said resultant image as a reference image to correct subsequent images made through said fiber-optic stack.

* * * * *